US006853592B2

(12) United States Patent
Kashiwazaki

(10) Patent No.: US 6,853,592 B2
(45) Date of Patent: Feb. 8, 2005

(54) SEMICONDUCTOR MEMORY DEVICE PERMITTING CONTROL OF INTERNAL POWER SUPPLY VOLTAGE IN PACKAGED STATE

(75) Inventor: Yasuhiro Kashiwazaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/642,213

(22) Filed: Aug. 18, 2003

(65) Prior Publication Data

US 2004/0170067 A1 Sep. 2, 2004

(30) Foreign Application Priority Data

Feb. 28, 2003 (JP) ........................................ 2003-053141

(51) Int. Cl.[7] .............................................. G11C 7/00
(52) U.S. Cl. .................... 365/189.09; 365/226
(58) Field of Search ........................... 365/189.09, 226

(56) References Cited

U.S. PATENT DOCUMENTS 6,240,032 B1 * 5/2001 Fukumoto .................... 365/222
6,449,208 B1 * 9/2002 Kono et al. ................... 365/226
6,477,090 B2 * 11/2002 Yamaki et al. ........... 365/189.09
6,498,469 B2 * 12/2002 Kobayashi ..................... 323/313

FOREIGN PATENT DOCUMENTS

JP          P2002-15599 A       1/2002

* cited by examiner

*Primary Examiner*—Hoai Ho
(74) *Attorney, Agent, or Firm*—McDermott Will & Emery LLP

(57) ABSTRACT

A selector selects one standard voltage from among divided voltages from a voltage dividing circuit and a reference voltage from a reference voltage generating circuit, in accordance with a test mode enable signal and a reference voltage select signal. An internal voltage generating circuit receives the standard voltage from the selector and generates an internal power supply voltage.

4 Claims, 8 Drawing Sheets

SEMICONDUCTOR MEMORY DEVICE PERMITTING CONTROL OF INTERNAL POWER SUPPLY VOLTAGE IN PACKAGED STATE

BACKGROUND OF THE INVENTION

1. Field of the Invention

The present invention relates to semiconductor memory devices, and more particularly to a semiconductor memory device which permits control of an internal power supply voltage in a packaged state.

2. Description of the Background Art

Generally, in a semiconductor memory device such as a dynamic random access memory (DRAM), a reference voltage is firstly generated based on an externally supplied power supply voltage, and a plurality of kinds of internal power supply voltages are generated from the reference voltage.

A conventional semiconductor memory device described in Japanese Patent Laying-Open No. 2002-15599 includes a reference voltage generating circuit which receives an external power supply voltage and generates an internal reference voltage, a standard voltage circuit which receives the internal reference voltage and outputs a standard voltage of a prescribed value, and an internal power supply circuit which generates an internal power supply voltage based on the standard voltage of the prescribed value and the external power supply voltage. The standard voltage circuit blows an arbitrary fuse based on a measurement of the standard voltage obtained by probing, so that it can fine-adjust the standard voltage to a preset voltage value before output.

With a semiconductor memory device such as a DRAM, it is generally necessary to evaluate an operation margin of the semiconductor memory device with respect to an internal power supply voltage in a test before shipment as a product.

The conventional semiconductor memory device described in Japanese Patent Laying-Open No. 2002-15599, however, cannot control the internal power supply voltage in a molded state having the semiconductor chip covered with a mold resin and packaged, and thus, it is impossible to evaluate the operation margin of the semiconductor memory device with respect to the internal power supply voltage in the molded state from the outside.

SUMMARY OF THE INVENTION

An object of the present invention is to provide a semiconductor memory device which allows the operation margin of the semiconductor memory device with respect to an internal power supply voltage to be evaluated from the outside even in a molded state.

The present invention provides a semiconductor memory device accommodated in a package, including a reference voltage generating circuit which generates a reference voltage based on an external power supply voltage, a voltage dividing circuit which divides the external voltage provided from the outside of the package into a plurality of divided voltages having voltage values different from each other, a select circuit which selects a standard voltage from among the reference voltage and the plurality of divided voltages in accordance with a control signal supplied from the outside of the package, and an internal voltage generating circuit which generates an internal power supply voltage based on the standard voltage.

According to the present invention, it is possible to evaluate an operation margin of the semiconductor memory device with respect to an internal power supply voltage from the outside, even in a molded state.

The foregoing and other objects, features, aspects and advantages of the present-invention will become more apparent from the following detailed description of the present invention when taken in conjunction with the accompanying drawings.

DESCRIPTION OF THE PREFERRED EMBODIMENTS

Figure 1:
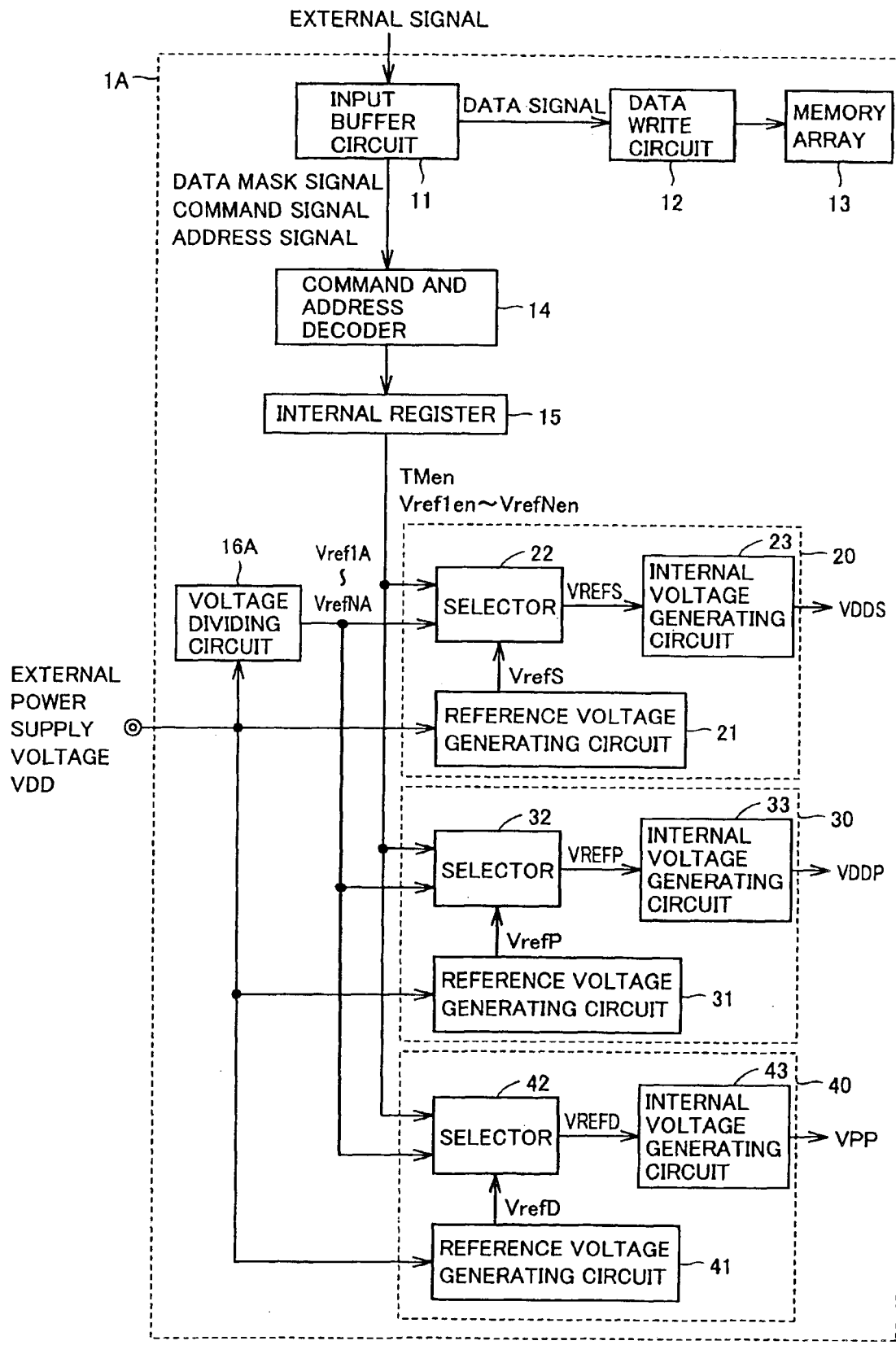
FIG. 1 is a block diagram showing a schematic configuration of a semiconductor memory device 1A according to a first embodiment of the present invention.

Hereinafter, embodiments of the present invention will be described in detail with reference to the drawings. In the drawings, the same or corresponding portions are denoted by the same reference characters, and description thereof will not be repeated.

First Embodiment

Referring to FIG. 1, the semiconductor memory device 1A according to the first embodiment of the present invention includes an input buffer circuit 11, a data write circuit 12, a memory array 13, a command and address decoder 14, an internal register 15, a voltage dividing circuit 16A, and internal voltage generating portions 20, 30, 40.

Input buffer circuit 11 receives an externally supplied external signal, and outputs a data signal to data write circuit 12, and outputs a data mask signal, a command signal and an address signal to command and address decoder 14. Data write circuit 12 writes the input data signal to a memory cell in memory array 13. The data mask signal output from input buffer circuit 11 masks the data signal input/output in semiconductor memory device 1A.

Command and address decoder 14 decodes the command signal and the address signal. Of the decoded command signal, information such as read latency and burst length set by a mode register set (MRS) command is stored in internal register 15. Internal register 15 also stores a test mode enable signal TMen and reference voltage select signals Vref1en-VrefNen. (both of which will be described later).

Writing of information to internal register 15 is controlled by the decoded command signal. The information writing operation to internal register 15 may be carried out in the same manner as the MRS operation in a standard DRAM. Internal register 15 is preferably reset to a prescribed value upon power on. This is because an unstable register value upon power on may lead to erroneous activation of test mode enable signal TMen even when a normal operation of semiconductor memory device 1A is desired.

Voltage dividing circuit 16A divides an externally provided external power supply voltage VDD into a plurality of divided voltages Vref1A-VrefNA, and outputs the divided voltages to respective internal voltage generating portions 20, 30, 40.

Internal voltage generating portion 20 includes a reference voltage generating circuit 21 which generates a reference voltage VrefS, a selector 22 which selects a standard voltage VREFS, and an internal voltage generating circuit 23 which generates an internal power supply voltage VDDS. Internal power supply voltage VDDS is used, e.g., as a power source of memory cells.

Internal voltage generating portion 30 includes a reference voltage generating circuit 31 which generates a reference voltage VrefP, a selector 32 which selects a standard voltage VREFP, and an internal voltage generating circuit 33 which generates an internal power supply voltage VDDP. Internal power supply voltage VDDP is used, e.g., as a power source of peripheral circuits within semiconductor memory device 1A.

Internal voltage generating portion 40 includes a reference voltage generating circuit 41 which generates a reference voltage VrefD, a selector 42 which selects a standard voltage VREFD, and an internal voltage generating circuit 43 which generates an internal power supply voltage VPP. Internal power supply voltage VPP is used, e.g., as a power source of word lines.

Internal voltage generating portions 20, 30, 40 have the identical configurations, so that reference voltage generating circuit 21, selector 22 and internal voltage generating circuit 23 included in internal voltage generating portion 20 will be described representatively.

Reference voltage generating circuit 21 receives externally provided external power supply voltage VDD, and generates reference voltage VrefS. Selector 22, in response to test mode enable signal TMen and reference voltage select signals Vref1en-VrefNen, selects one standard voltage VREFS from among divided voltages Vref1A-VrefNA and reference voltage VrefS. Test mode enable signal TMen and reference voltage select signals Vref1en-VrefNen are included in the externally supplied external signals. Internal voltage generating circuit 23 receives standard voltage VREFS output from selector 22, and generates internal power supply voltage VDDS.

Hereinafter, specific circuit configurations of voltage dividing circuit 16A, reference voltage generating circuit 21, selector 22, and internal voltage generating circuit 23 as the characteristic portions of semiconductor memory device 1A of the first embodiment will be described.

Figure 2:
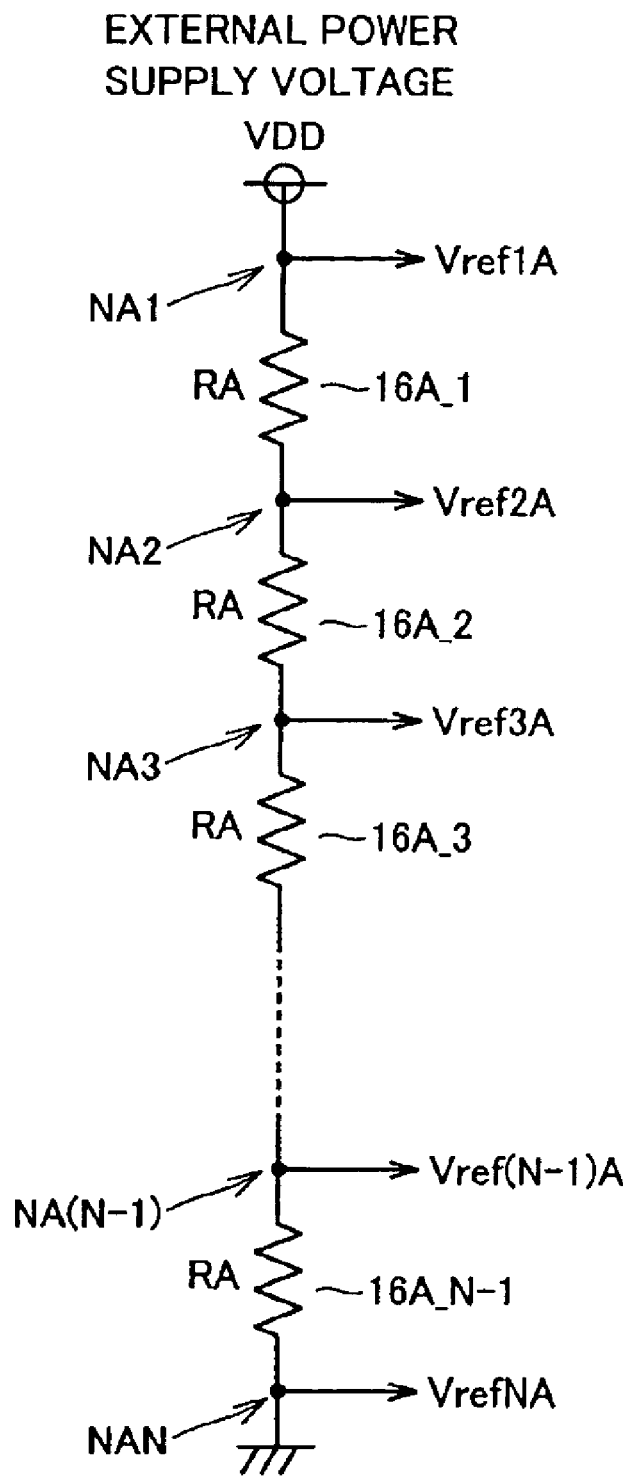
FIG. 2 is a circuit diagram showing a circuit configuration of a voltage dividing circuit 16A according to the first embodiment.

Referring to FIG. 2, voltage dividing circuit 16A according to the first embodiment has resistance elements 16A_1 to 16A_N−1, each of the same resistance value RA, connected in series between a node provided with external power supply voltage VDD and a ground node. Resistance element 16A_k (k=1 to N−1) is connected between a node NAk and a node NA(k+1). Node NAk (k=1 to N) is provided with a divided voltage VrefkA. The voltage value of divided voltage VrefkA is represented as:

$$VrefkA = VDD \cdot (N-k)/(N-1).$$

Figure 3:
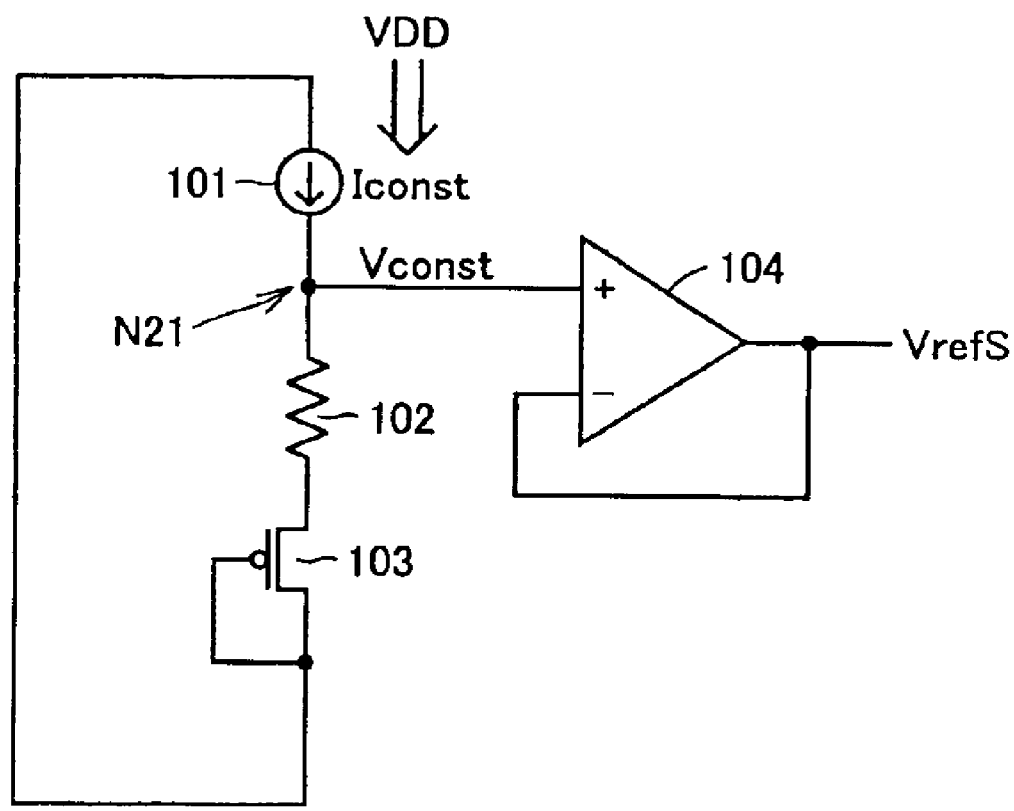
FIG. 3 is a circuit diagram showing by way of example a circuit configuration of a reference voltage generating circuit 21 according to the first embodiment.

Referring to FIG. 3, reference voltage generating circuit 21 according to the first embodiment includes a constant current source 101, a resistance element 102, a P channel MOS transistor 103, and an operational amplifier 104.

Constant current source 101 generates a constant current Iconst based on external power supply voltage VDD. Constant current source 101, resistance element 102 and diode-connected P channel MOS transistor 103 are connected in a loop, and a constant voltage Vconst appears on an output node N21 of constant current source 101. Operational amplifier 104, constituting a voltage follower having its input terminal on a minus side and its output terminal connected with each other, receives constant voltage Vconst at its input terminal on a plus side, and outputs reference voltage VrefS.

Figure 4:
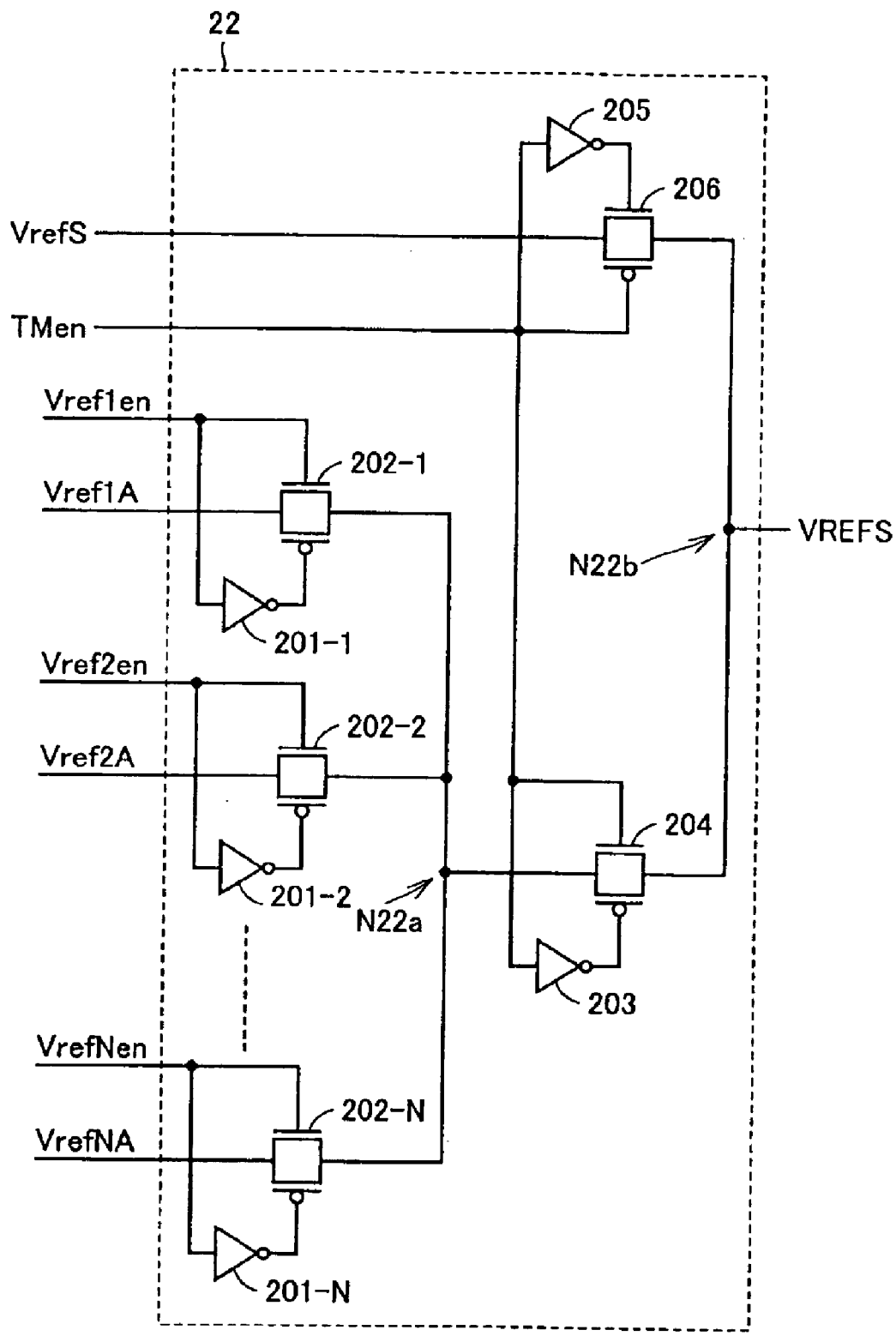
FIG. 4 is a circuit diagram showing a circuit configuration of a selector 22 according to the first embodiment.

Referring to FIG. 4, selector 22 according to the first embodiment includes inverters 201-1 to 201-N, 203, 205, and transfer gates 202-1 to 202-N, 204, 206.

Reference voltage select signal Vrefken (k=1 to N) is input to transfer gate 202-k as it is or after inverted by inverter 201-k. Transfer gate 202-k provides a node N22a with a divided voltage VrefkA when reference voltage select signal Vrefken is at an H level (logical high).

Test mode enable signal TMen is input to transfer gates 204, 206 as it is or after inverted by inverters 203, 205, respectively. Transfer gate 204 supplies a voltage on node N22a to a node N22b when test mode enable signal TMen is at an H level. Transfer gate 206 supplies reference voltage VrefS to node N22b when test mode enable signal TMen is at an L level (logical low). The voltage provided to node N22b is output as standard voltage VREFS.

Figure 5:
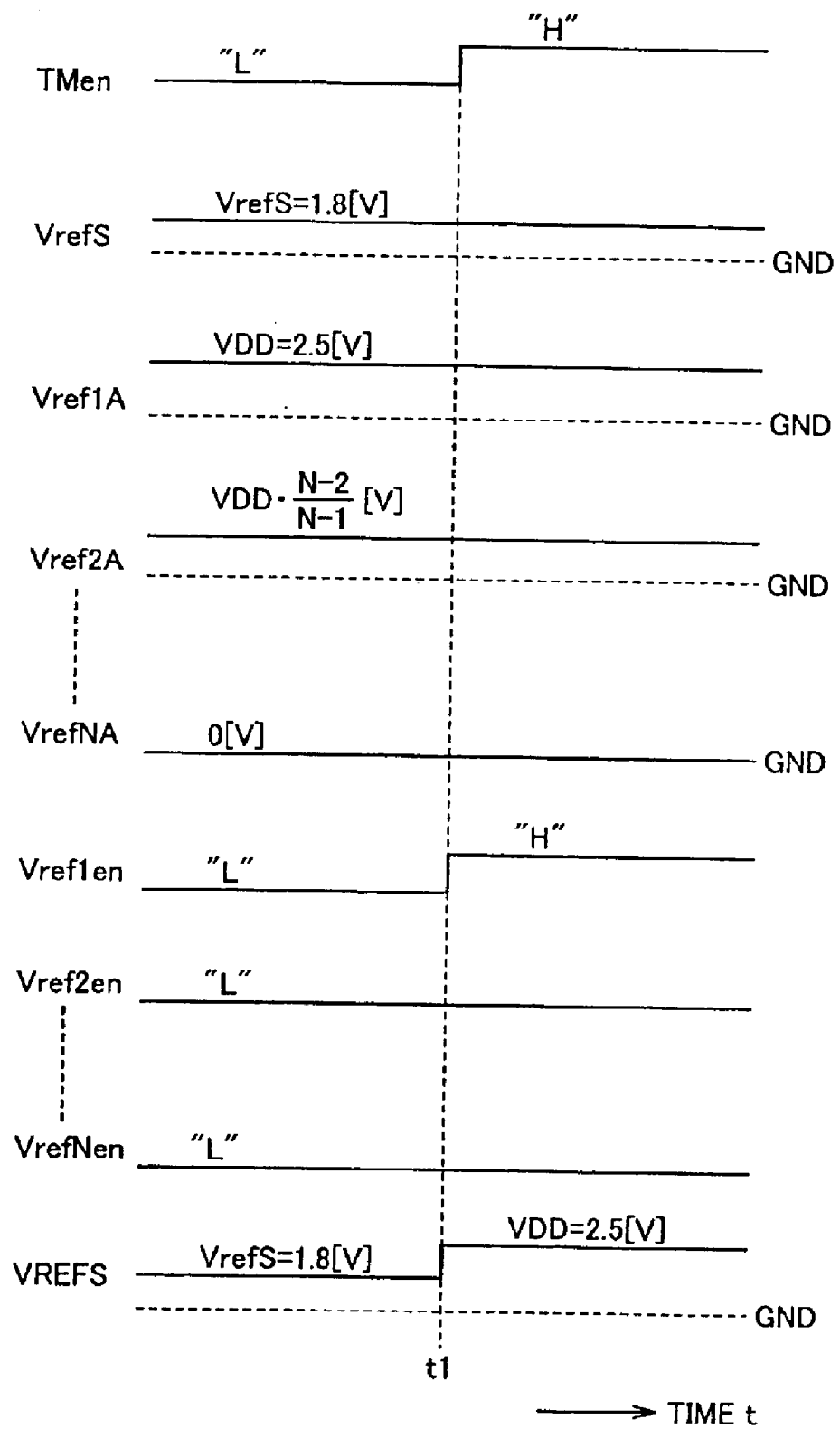
FIG. 5 is a timing chart illustrating a circuit operation of the selector 22 according to the first embodiment.

FIG. 5 is a timing chart illustrating the circuit operation of selector 22 according to the first embodiment. Here, assume that reference voltage VrefS=1.8 V. Further, as described in conjunction with voltage dividing circuit 16A in FIG. 2, divided voltage Vref1A is equal to external power supply voltage VDD. Here, assume that external power supply voltage VDD=2.5 V.

Before time t1, test mode enable signal TMen and reference voltage select signal Vrefken (k=1 to N) are both at an L level. At this time, transfer gate 206 in FIG. 4 turns on, and standard voltage VREFS becomes reference voltage VrefS= 1.8 V.

After time t1, test mode enable signal TMen and reference voltage select signal Vref1en both attain an H level, while reference voltage select signal Vrefken (k=2 to N) remains at an L level. At this time, transfer gates 202-1, 203 in FIG. 4 turn on, and standard voltage VREFS becomes external power supply voltage VDD=2.5 V.

Standard voltages VREFS of a plurality of voltage values can be selected by control from the outside, since test mode enable signal TMen and reference voltage select signals Vref1en-VrefNen are externally supplied.

Figure 6:
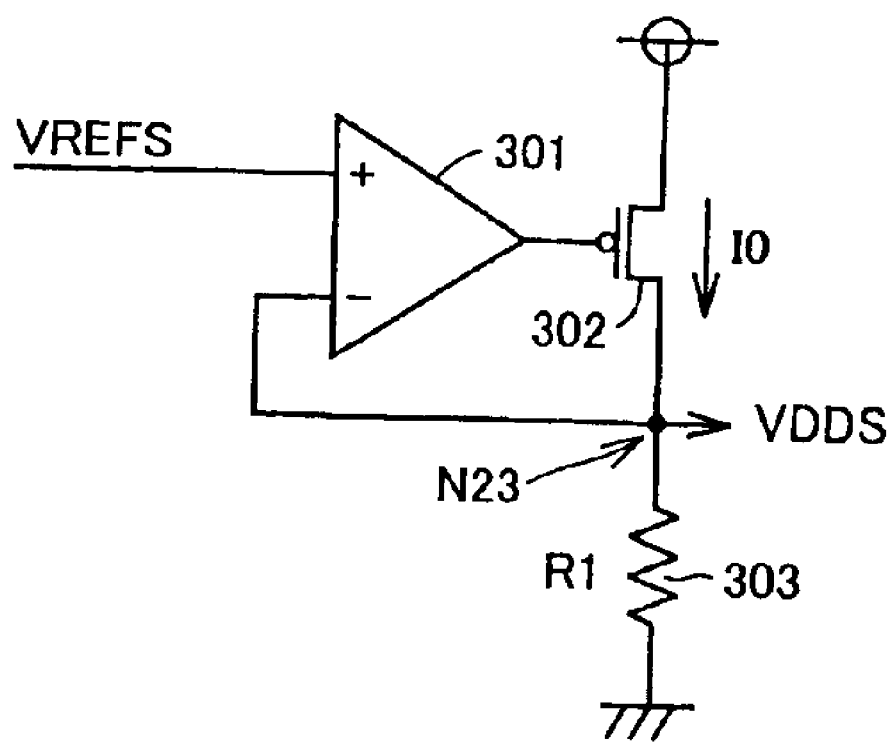
FIG. 6 is a circuit diagram showing by way of example a circuit configuration of an internal voltage generating circuit 23 according to the first embodiment

Referring to FIG. 6, internal voltage generating circuit 23 according to the first embodiment includes an operational amplifier 301, a P channel MOS transistor 302, and a resistance element 303.

Operational amplifier 301 has its input terminal on a minus side connected to a node N23, and its output terminal connected to a gate of P channel MOS transistor 302. P channel MOS transistor 302 and resistance element 303 are connected in series between a power supply node and a ground node, sandwiching node N23 therebetween. Operational amplifier 301 has its input terminal on a plus side provided with standard voltage VREFS. A constant current I0 flows through resistance element 303 having a resistance value R1. At this time, internal voltage VDDS=R1·I0 appears on node N23. The magnitude of internal power supply voltage VDDS is substantially equal to standard voltage VREFS.

As such, internal voltage generating portion 20 selects one standard voltage VREFS from among externally supplied dividing voltage Vref1A-VrefNA and reference voltage VrefS in accordance with test mode enable signal TMen and reference voltage select signals Vref1en-VerfNen, and generates internal power supply voltage VDDS based on standard voltage VREFS.

As described above, according to the first embodiment, one standard voltage is selected from among a reference voltage and a plurality of divided voltages in accordance with externally supplied control signals. Accordingly, it is possible to evaluate an operation margin of the semiconductor memory device with respect to an internal power supply voltage from the outside, even in a molded state.

Second Embodiment

Figure 7:
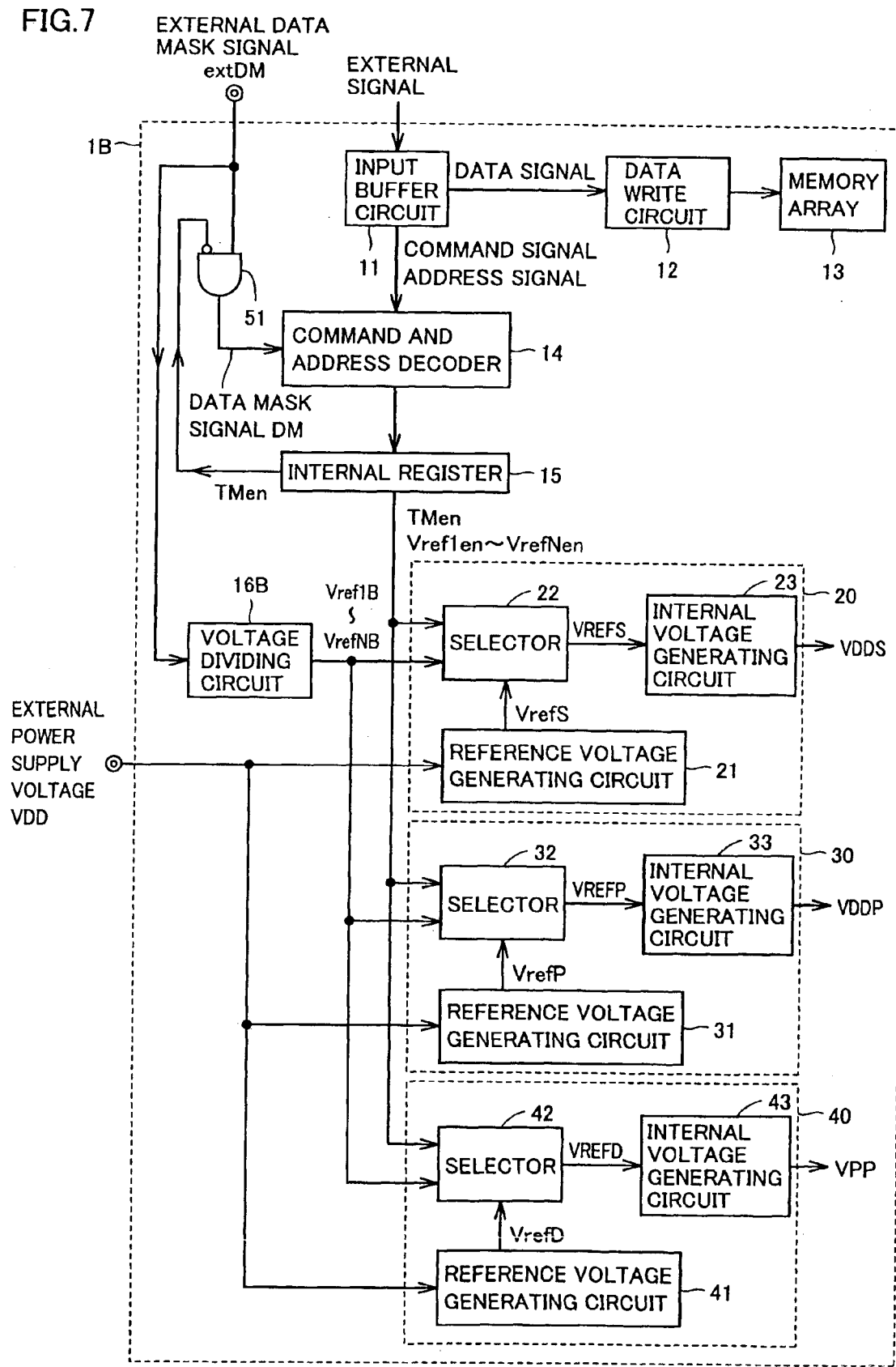
FIG. 7 is a block diagram showing a schematic configuration of a semiconductor memory device 1B according to a second embodiment of the present invention.

Referring to FIG. 7, the semiconductor memory device 1B according to the second embodiment of the present invention includes an input buffer circuit 11, a data write circuit 12, a memory array 13, a command and address decoder 14, an internal register 15, a voltage dividing circuit 16B, internal voltage generating portions 20, 30, 40, and an AND gate 51.

Input buffer circuit 11 receives an externally supplied external signal, and outputs a data signal to data write circuit 12, and outputs a command signal and an address signal to command and address decoder 14. Data write circuit 12 writes the input data signal to a memory cell in memory array 13.

Command and address decoder 14 decodes the command signal and the address signal. Of the decoded command signal, information such as read latency and burst length set by the mode resister set (MRS) command is stored in internal register 15. Internal register 15 also stores test mode enable signal TMen, and reference voltage select signals Vref1en-VrefNen.

Writing of information into internal register 15 is controlled by the decoded command signal. The information writing operation into internal register 15 may be the same as the MRS operation in a standard DRAM. Internal register 15 is preferably reset to a prescribed value upon power on, since an unstable register value upon power on may cause erroneous activation of test mode enable signal TMen when a normal operation of semiconductor memory device 1B is desired.

AND gate 51 receives an inverted signal of test mode enable signal TMen output from internal register 15 and an externally supplied external data mask signal extDM, and outputs a data mask signal DM to command and address decoder 14. The data signal input/output in semiconductor memory device 1B is masked by data mask signal DM.

When test mode enable signal TMen is at an H level, data mask signal DM is always at an L level, irrelevant to a logical state of external data mask signal extDM. As such, when semiconductor memory device 1B of the second embodiment enters a test mode, the data signal input/output in semiconductor memory device 1B is not masked by data mask signal DM. This allows a test concerning input/output of the data signal to be carried out even in a test mode.

Voltage dividing circuit 16B divides a data mask signal voltage VDM into a plurality of divided voltages Vref1B-VrefNB, and outputs the divided voltages to respective internal voltage generating portions 20, 30, 40.

Internal voltage generating portions 20, 30, 40 of the second embodiment are identical to internal voltage generating portions 20, 30, 40 of the first embodiment except that divided voltages Vref1A-VrefNA are replaced with divided voltages Vref1B-VrefNB, and thus, description thereof is not repeated here.

Hereinafter, a specific circuit configuration of voltage dividing circuit 16B will be described as the characteristic portion of semiconductor memory device 1B of the second embodiment compared to semiconductor memory device 1A of the first embodiment.

Figure 8:
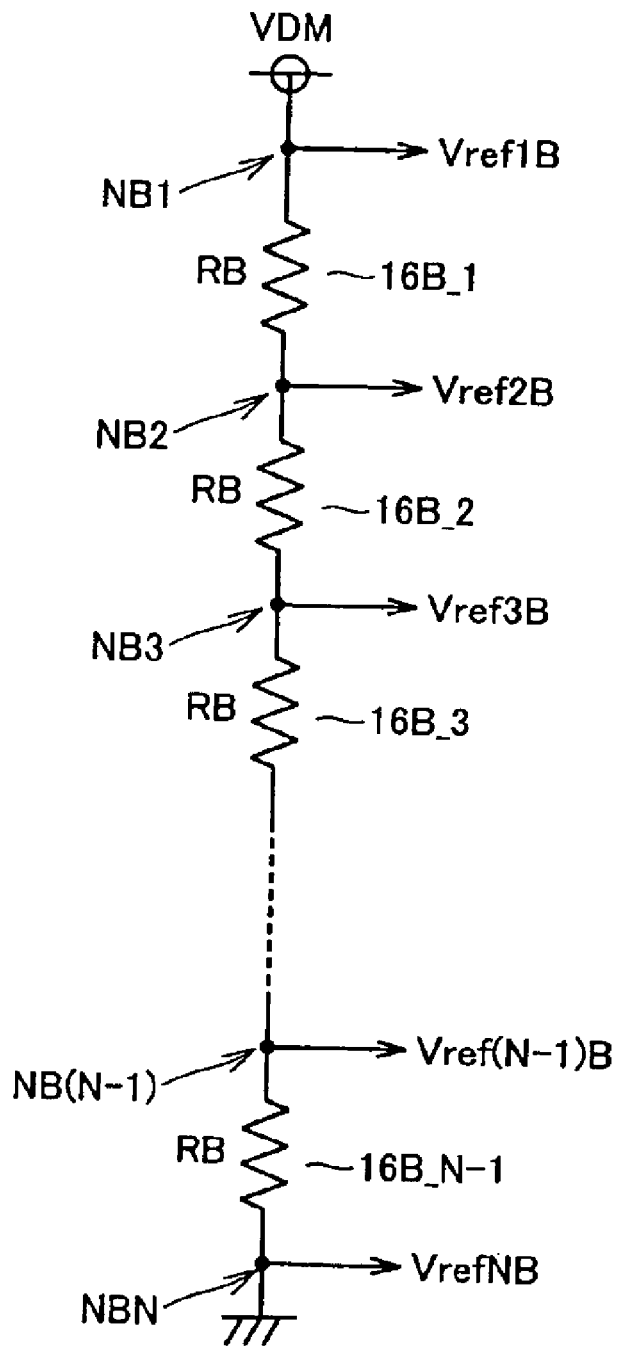
FIG. 8 is a circuit diagram showing a circuit configuration of a voltage dividing circuit 16B according to the second embodiment.

Referring to FIG. 8, voltage dividing circuit 16B according to the second embodiment has resistance elements 16B_1 to 16B_N−1, each of the same resistance value RB, connected in series between a data mask pin provided with data mask signal voltage VDM and a ground node. Resistance element 16B_k (k=1 to N−1) is connected between a node NBk and a node NB(k+1). Node NBk (k=1 to N) is provided with a divided voltage VrefkB, of which voltage value is represented as:

$$V\text{ref}kB = VDM \cdot (N-k)/(N-1).$$

Unlike external power supply voltage VDD, data mask signal voltage VDM has its voltage value that can be set flexibly, even to a voltage value higher than external power supply voltage VDD. This permits voltage settings of divided voltages Vref1B-VrefNB of the second embodiment in a broader range than those of divided voltages Vref1A-VrefNA of the first embodiment.

As described above, according to the second embodiment, one standard voltage is selected from among a reference voltage and a plurality of divided voltages in accordance with externally supplied control signals, and thus, evaluation of the operation margin of the semiconductor memory device in a molded state with respect to an internal power supply voltage is possible from the outside in a more flexible manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device accommodated in a package, comprising:

a reference voltage generating circuit generating a reference voltage based on an external power supply voltage;

a voltage dividing circuit dividing an external voltage supplied from the outside of said package into a plurality of divided voltages having voltage values different from each other;

a select circuit selecting one standard voltage from among said reference voltage and said plurality of divided voltages in accordance with a control signal supplied from the outside of said package; and an internal voltage generating circuit generating an internal power supply voltage based on said standard voltage.

2. The semiconductor memory device according to claim 1, wherein said voltage dividing circuit includes an external power supply node provided with said external power supply voltage as said external voltage, and a plurality of resistance elements connected in series between said external power supply node and a ground node, and dividing said external power supply voltage into a plurality of divided voltages having voltages values different from each other.

3. The semiconductor memory device according to claim 1, wherein said voltage dividing circuit includes a data mask pin provided with a data mask signal voltage as said external voltage, and a plurality of resistance elements connected in series between said data mask pin and a ground node, and dividing said data mask signal voltage into a plurality of divided voltages having voltage values different from each other.

4. The semiconductor memory device according to claim 1, wherein said select circuit includes a divided voltage select portion selecting one selected voltage from among said plurality of divided voltages in accordance with a plurality of select signals provided corresponding to said plurality of divided voltages, and a standard voltage select portion selecting said reference voltage as said standard voltage when a test mode control signal takes one logical level, and selecting said selected voltage as said standard voltage when said test mode control signal takes another logical level.

* * * * *